United States Patent [19]

Kane et al.

[11] 3,949,146

[45] Apr. 6, 1976

[54] PROCESS FOR DEPOSITING TRANSPARENT ELECTRICALLY CONDUCTIVE TIN OXIDE COATINGS ON A SUBSTRATE

[75] Inventors: James Kane, Affoltern a/Albis; Hanspeter Schweizer, Zurich, both of Switzerland

[73] Assignee: RCA Corporation, New York, N.Y.

[22] Filed: Aug. 24, 1973

[21] Appl. No.: 391,359

[52] U.S. Cl. ............... 428/432; 427/109; 427/126; 427/248; 427/255; 428/539
[51] Int. Cl.² .......................................... B05D 5/12
[58] Field of Search......... 117/106 R, 211; 427/109, 427/126, 248, 255

[56] References Cited
UNITED STATES PATENTS

| | | |
|---|---|---|
| 2,522,531 | 9/1950 | Mochel............................ 117/211 X |
| 2,833,902 | 5/1958 | Gaiser et al..................... 117/211 X |
| 3,014,815 | 12/1961 | Lely et al........................ 117/211 X |
| 3,331,702 | 7/1967 | Dates et al........................... 117/211 |
| 3,537,890 | 11/1970 | Roe...................................... 117/211 |
| 3,647,531 | 3/1972 | Matsushita et al................. 117/211 |
| 3,705,054 | 12/1972 | Matsushita et al................. 117/211 |

*Primary Examiner*—Harris A. Pitlick
*Attorney, Agent, or Firm*—Glenn H. Bruestle; Arthur E. Wilfond; Birgit E. Morris

[57] ABSTRACT

Certain volatile organotin compounds are volatilized in a heated carrier gas stream and brought into contact with a preheated substrate to be coated in an atmosphere containing oxygen. The process is particularly applicable to deposition of tin oxide on glass faceplates of cathode ray tubes.

12 Claims, 3 Drawing Figures

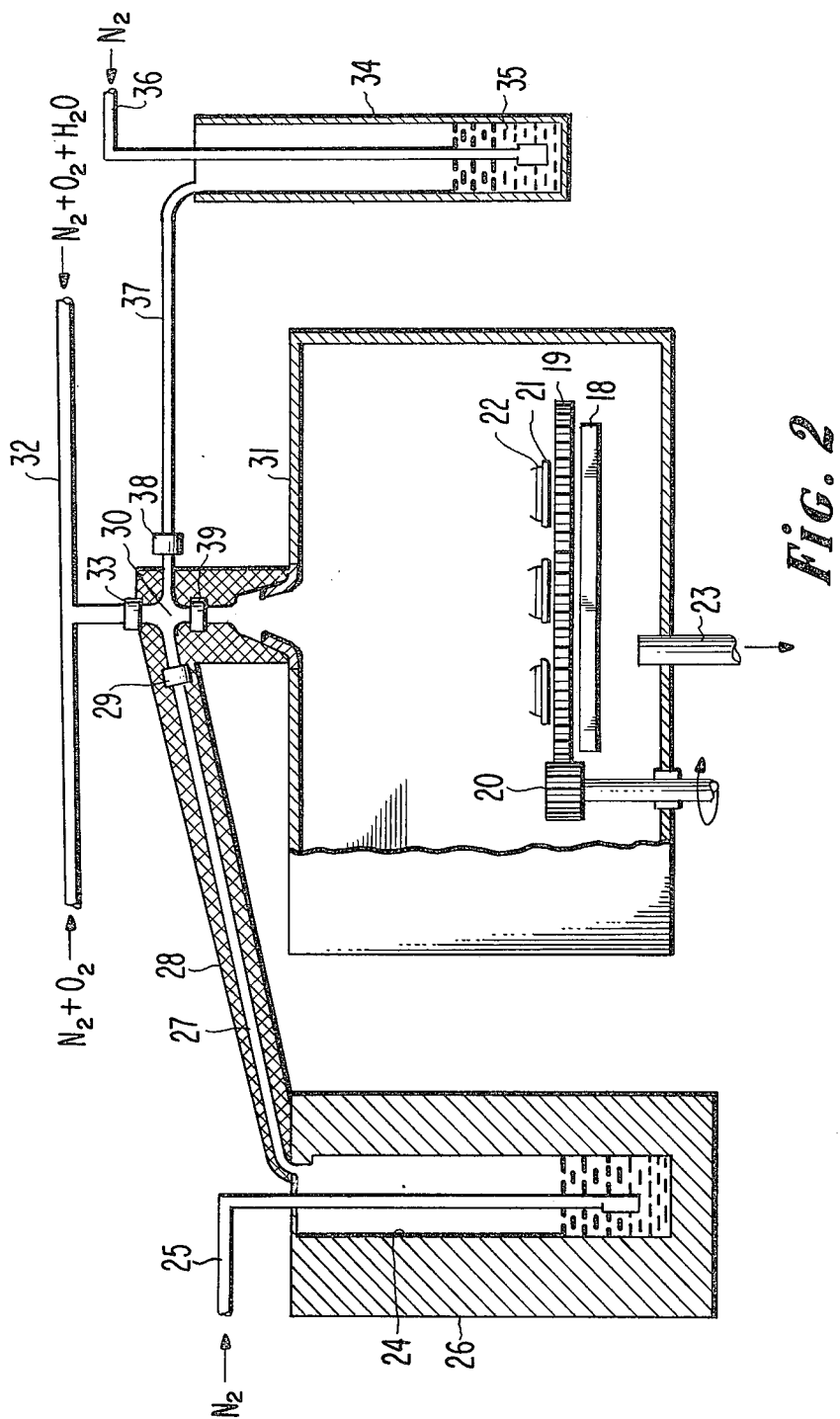

PROCESS FOR DEPOSITING TRANSPARENT ELECTRICALLY CONDUCTIVE TIN OXIDE COATINGS ON A SUBSTRATE

This invention relates to a process for fabricating transparent, electrically conductive tin oxide coatings. More particularly, this invention relates to a process for fabricating tin oxide coatings by chemical vapor deposition.

BACKGROUND OF THE INVENTION

Transparent, conductive tin oxide coatings on substrates such as glass, are widely employed for windshields, display devices, faceplates of cathode ray tubes, liquid crystal cells and the like. For the fabrication of faceplates of cathode ray tubes or vidicon faceplates, for example, electrical conductivity, measured as resistivity, should be on the order of less than 50,000 ohms per square and transparency, measured as percent light transmission in the visible range, should be over 80%. The most widely employed commercial process for fabricating tin oxide coatings is based on the pyrolysis of tin halide compounds. A compound such as stannic chloride is dissolved in a solvent and the solution sprayed onto the surface of a preheated substrate where the stannic chloride is pyrolized to form tin oxide. This method is inexpensive but is difficult to control to fabricate uniform, haze-free coatings, probably due to the action of hydrochloric acid, a by-product of the reaction, on the surface of the substrate.

The pyrolysis of organotin compounds has also been tried. U.S. Pat. No. 2,567,331 discloses a method of applying a conductive, transparent coating of tin oxide to a glass substrate by spraying liquified dibutyl tin diacetate onto the glass which was preheated to its melting point. The resultant coating, while electrically conducting, had a less than satisfactory transmission of 58% and a high reflectivity of 20%. Some improvement was obtained by spraying the tin compound dissolved in an alcohol solvent, when transmission was increased and reflectivity was decreased. Very high spray temperatures are required for this process, however, on the order of 600°–700°C., which severely limit the substrates that can be employed and largely preclude the use of inexpensive, ordinary glass substrates. Another disadvantage of this process is that the tin oxide coating had a brownish appearance.

U.S. Pat. No. 3,107,177 discloses an improvement in the above process whereby fluorine is introduced into the tin oxide coating. The resultant tin oxide coatings have improved conductivity, but again, high temperatures are required which can result in distortion or warping of low melting substrates such as glass.

Thus a process for preparing transparent, haze-free, conductive coatings of tin oxide which is rapid and inexpensive and can be carried out at low temperatures would be highly desirable.

SUMMARY OF THE INVENTION

We have found that thin, uniform, transparent, electrically conducting coatings of tin oxide can be deposited onto low melting substrates in a simple, inexpensive manner by vaporizing certain volatile organotin compounds and contacting the vapor with a heated substrate in the presence of oxygen.

BRIEF DESCRIPTION OF THE DRAWINGS

FIG. 2 is a sectional elevational view of another apparatus suitable for carrying out the process of the invention.

DETAILED DESCRIPTION OF THE INVENTION

According to the present process, certain organotin compounds which are volatile at low temperatures can be vaporized in a heated carrier gas stream and transported to a reaction chamber having an oxygen atmosphere, or an oxygen atmosphere also containing water, where the vapor is contacted with a preheated substrate. The tin oxide coatings can be doped with antimony when coatings of high conductivity are desired.

Figure 1:
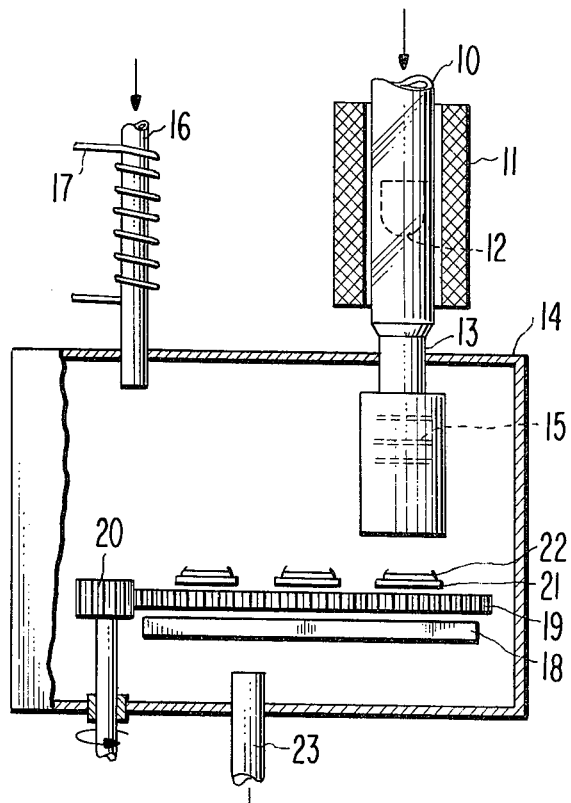
FIG. 1 is a sectional elevational view of an apparatus suitable for carrying out the process of the invention.

Referring to FIG. 1, a carrier gas is introduced into an inlet tube 10 which is encased in a furnace 11 and wherein is situate a container 12 for the organotin compound. The carrier gas and the organotin compound are heated to a temperature of about 100° to 200°C., preferably 100° to 150°C., to volatilize the organotin compound and form a reactant gas stream. The reactant gas stream passes via a tube 13 to a sealed reaction chamber 14 through a series of baffles 15. An oxygen-containing gas is also pumped into the reaction chamber 14 via an inlet tube 16 where it is preheated to about the temperature of the reactant gas stream by a heating coil 17 which surrounds the inlet tube 16.

The reaction chamber 14 contains a heater plate 18. A circular geared platform 19 is mounted adjacent to the heater plate 18 so that it can rotate by engagement with a driver gear 20 turned by a motor (not shown). Mounted on the platform 19 is a series of mounts 21 for the substrates 22 to be coated. Spent gases exit from the reaction chamber 14 via an outlet tube 23.

The organotin compounds suitable for use in the present process are compounds that are volatile at temperatures below about 200°C., such as compounds having the formula $(R{\rightarrow}_2Sn{\leftarrow}OOCR)_2$ or $(R_3Sn{\rightarrow}_2O$ wherein R is a lower alkyl group. Suitable compounds include dibutyl tin diacetate, bis(tri-n-propyl) tin oxide and bis(tin-n-butyl) tin oxide, for example.

The carrier gas can be any inert gas, such as one or more of neon, argon, krypton, nitrogen and the like and can contain oxygen as well. The oxygen-containing gas can be oxygen or oxygen admixed with an inert gas, such as nitrogen. Water vapor can also be present. The gas flows should be maintained at a level adequate to ensure sufficient oxygen in the reaction chamber for reaction of the organotin compound to form tin oxide to occur. If the oxygen concentration is too low, the resultant tin oxide films have decreased conductivity. The presence of water vapor in the oxygen-containing gas generally improves conductivity of the tin oxide film.

When tin oxide coatings are prepared, the substrate to be coated is brought to a temperature of from about 375° to 500°C. Too low a temperature results in an inefficiently low rate of reaction. Very high temperatures of reaction, on the other hand, limit the nature of the substrate that can be employed. In addition, the conductivity of the tin oxide coating is higher at lower deposition temperatures, probably due to reduced diffusion or migration of alkali metal impurities from the surface of the substrate to the tin oxide coating at lower deposition temperatures. Temperatures in the range between about 425°–450°C. are preferred. When antimony-doped tin oxide films are prepared, higher temperatures, on the order of 500°–575°C., are preferred.

The time required for deposition can vary from about five minutes up to an hour or more, depending on the temperatures of the carrier gas and the substrate and the thickness of the tin oxide coating desired. In general, coatings of high transparency and good electrical conductivity can be formed in about 5–15 minutes. Longer reaction times will result in increasing migration of impurities into the coating from the substrate. If the thickness of the film is too thin, conductivity is low; if it is too high, transparency will be adversely affected.

The present process can deposit thin tin oxide coatings on a variety of substrates which are heat resistant at deposition temperatures. Although glass has been referred to particularly hereinabove, other inert substrates such as quartz, sapphire, garnet, alumina, silicon, gallium arsenide, spinel, magnesium oxide, strontium titanate, gallium phosphide and the like, can be substituted.

When an apparatus is employed whereby the substrates to be coated are rotated during deposition of the tin oxide coating, such as is shown in FIG. 1, slight variations in the temperature of the substrate, gas flow rate, volume and the like, are not critical and will not adversely affect the uniformity of the tin oxide coating deposited. However, if the substrates to be coated are mounted on a stationary platform, the gas flow rates, temperatures, relative amounts of incoming gases and the like must be more carefully regulated to ensure uniform tin oxide coatings. Optimum parameters of these variables for each organotin compound and apparatus employed can be determined by a series of test runs as will be known to one skilled in the art.

The invention will be further illustrated by the following examples, but it is to be understood that the invention is not meant to be limited to the details described therein. In the examples, sheet resistivity was measured in conventional manner using a four-point probe having a point separation of the probe of 10 mils.

Optical transmission was measured by comparing the light transmitted by a coated faceplate with that of a non-coated vidicon faceplate as the reference beam.

Thickness measurements were made using a Sloan "Dektak" fitted with a 25 micron stylus after etching a step in the tin oxide coating using dilute hydrochloric acid and zinc dust.

EXAMPLE 1

A series of vidicon faceplates of Corning 7056 glass were coated with tin oxide in the apparatus of FIG. 1. A mixture having a flow rate of 130 cc/min of oxygen and 1000 cc/min of nitrogen as the carrier gas was passed over dibutyl tin diacetate. Both the carrier gas and the organotin compound were heated to 150°C., thus vaporizing the organotin compound and mixing the vapor with the carrier gas. This mixture was then passed into the reaction chamber containing several faceplates heated to 450°C. An oxygen-containing gas flow of 900 cc/min of oxygen admixed with 400 cc/min of nitrogen was also passed into the reaction chamber. The faceplates were exposed for from 10–15 minutes, removed from the chamber and cooled. Table I below gives conductivity measurements and light transmission at varying wavelengths for coatings of several thicknesses. The control is a commercially available vidicon faceplate made by a tin halide spray process.

Table I

| Sample | Thickness, Angstroms | Time of Reaction, Minutes | Sheet Resistivity, ohms/square | % Transmission Wavelength of Light, Angstroms | | | | | |
|---|---|---|---|---|---|---|---|---|---|
| | | | | 4000 | 4400 | 4800 | 5200 | 5600 | 6000 |
| A | 900 | 15 | 10,200 | 96.8 | 92.0 | 87.8 | 84.6 | 82.9 | 81.9 |
| B | 1000 | 10 | 2,700 | 99.0 | 94.5 | 91.1 | 87.6 | 85.0 | 84.0 |
| C | 1250 | 15 | 2,000 | 86.2 | 95.0 | 99.4 | 98.8 | 97.0 | 94.2 |
| D | 1300 | 15 | 6,000 | 92.4 | 98.6 | 99.6 | 97.4 | 94.0 | 91.0 |
| E | 2600 | 30 | 1,150 | 84.1 | 79.2 | 89.5 | 98.3 | 96.1 | 89.0 |
| Control | — | — | 1,360 | 94.5 | 90.9 | 87.4 | 84.8 | 83.1 | 82.5 |

It is apparent that transmission in the visible wavelength is generally higher for faceplates coated according to the present invention than the commercially available faceplate.

Additional runs were made in the modified apparatus shown in FIG. 2. Referring to FIG. 2, the carrier gas is introduced into a closed container 24 for the organotin compound via an inlet tube 25. The container 24 is immersed in a boiling water bath 26. The carrier gas and the volatilized organotin compound passes via a tube 27 which is encased in a heater tape 28 maintained at about 135°C. through a valve 29 to the inlet tube 30 and into the reaction chamber 31. The oxygen-containing gas which has been bubbled through and is saturated with water, also at about 135°C., is fed to the inlet tube 30 via an inlet tube 32 through a valve 33. Optionally a second container 34, containing a volatile antimony compound 35 which is volatilized by passage of a heated carrier gas stream, as of nitrogen, via an inlet tube 36 and passes into the inlet tube 30 via a tube 37 and a valve 38, is also provided. The mixed reactant gas stream, now containing the volatilized metal compounds, the carrier gases and the oxygen-containing gases, is fed through a valve 39 into the reaction chamber 31 which is about 8½ inches in diameter and about 10 inches high, and is otherwise fitted as in FIG. 1.

EXAMPLE 2

A series of vidicon faceplates of Corning 7052 borosilicate glass were coated with tin oxide in the apparatus of FIG. 2 with the valve 38 shut off. In runs 1–6, a stream of nitrogen at 4400 cc/min was bubbled through the organotin compound. The flow rates of the oxygen-containing gas are summarized in Table II below. The substrates were maintained at a temperature of 420°C. and reaction was continued for 15 minutes except that run 2 was continued for 5 minutes and run 6 was continued for 10 minutes. The Table below also gives conductivity and light transmission measurements of the resultant coatings.

Table II

| Run | Oxygen gas flow, cc/min | Dry Nitrogen gas flow, cc/min | Water Saturated Nitrogen gas flow, cc/min | Thickness, Angstroms | Sheet Resistivity, ohms/sq. | % Transmission Wavelength of light, Angstroms | | | | | |
|---|---|---|---|---|---|---|---|---|---|---|---|
| | | | | | | 4000 | 4400 | 4800 | 5200 | 5600 | 6000 |
| 1 | 650 | 6700 | — | 3400 | 1404 | 91.6 | 86.4 | 88.5 | 96.8 | 99.0 | 96.0 |
| 2 | 6300 | — | — | 2500 | 2491 | 88.3 | 97.0 | 99.0 | 98.7 | 96.0 | 94.0 |
| 3 | 480 | 6700 | — | 3600 | 1586 | 85.0 | 85.4 | 96.6 | 99.4 | 97.1 | 92.2 |
| 4 | 1020 | — | 12,600 | 2900 | 634 | 87.0 | 96.8 | 99.1 | 98.7 | 96.0 | 88.0 |
| 5 | 6300 | — | 12,600 | 2500 | 815 | 91.4 | 98.5 | 99.0 | 96.2 | 91.7 | 89.0 |
| 6 | 1020 | — | 12,600 | 900 | 544 | 94.8 | 96.0 | 93.0 | 89.6 | 86.0 | 85.0 |

Figure 3:
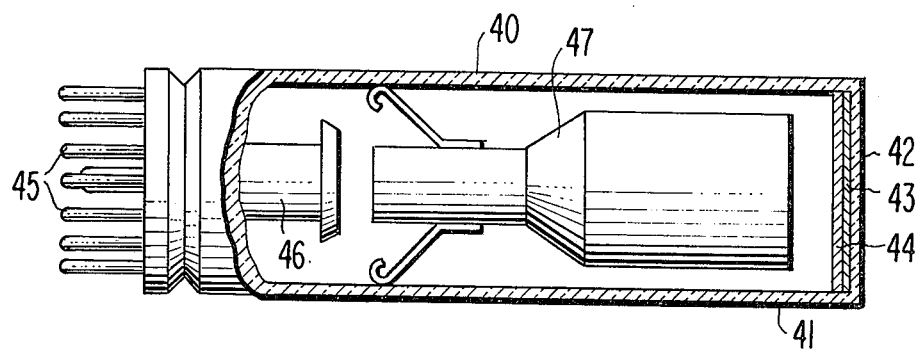
FIG. 3 is a partial cross-sectional side view of a vidicon camera tube indicating the position of the conductive coatings in the tube.

The above process is particularly preferred for coating vidicon faceplates for television camera tubes wherein a sheet resistivity maximum of 3000 ohms per square and a transmission minimum of about 85% is desired. FIG. 3 is a partially sectional side view of a vidicon type television camera tube including a layer of the tin oxide conductive coating on the faceplate thereof. The vidicon tube 40 comprises an elongated evacuated envelope 41 which may be made of glass for example. At one end of the envelope 41 is a glass faceplate 42. The faceplate 42 is sealed across one end of the envelope 41 by suitable means known to those skilled in the art. On the inner surface of the faceplate 42 is a transparent conductive coating 43 of tin oxide made by the process described herein. Over the electrically conductive coating 43 is a thin photoconductive layer 44. The other end of the tube 40 terminates in a stem structure having a plurality of lead-in contact prongs 45. Adjacent to the end having the contact prong 45 is mounted an electron gun assembly 46. Between the photoconductive layer 44 and the gun assembly 46 is mounted an elongated focusing electrode 47.

The present process can be further modified by adding a dopant such as antimony to the tin oxide coating, which increases the conductivity of the coating. Such coatings on glass are of particular interest as electrodes for liquid crystal cells for example, where high conductivity is essential.

EXAMPLE 3

A series of plates of quartz or heat resistant glass were coated with tin oxide doped with antimony in the apparatus of FIG. 2. A stream of dry nitrogen was bubbled through the organotin compound at a rate of 2020 cc/min. A stream of nitrogen at a rate of 180 cc/min. was also bubbled through liquid antimony pentachloride at room temperature and both streams transported to the mixing chamber where they were admixed with the oxygen-containing gas stream, a mixture of nitrogen and oxygen. Table III below summarizes the gas flow rates, substrate temperature and sheet resistivity and transmission measurements. Runs 1–4 employed glass substrates and runs 5–8 employed quartz substrates.

Table III

| Run | Oxygen-containing gas flow, cc/min. | Substrate Temperature, °C. | Sheet Resistivity, ohms/square | % Transmission Wavelength of Light, Angstroms | | | | | |
|---|---|---|---|---|---|---|---|---|---|
| | | | | 4000 | 4400 | 4800 | 5200 | 5600 | 6000 |
| 1 | O$_2$ – 290<br>N$_2$ – 1500 | 550 | 154 | 84.0 | 89.8 | 85.0 | 84.8 | 88.0 | 94.7 |
| 2 | O$_2$ – 290<br>N$_2$ – 1500 | 575 | 218 | 76.8 | 84.7 | 89.6 | 83.6 | 81.7 | 86.5 |
| 3 | O$_2$ – 1500<br>N$_2$ – 290 | 550 | 336 | 91.6 | 83.0 | 89.2 | 91.2 | 96.0 | 94.2 |
| 4 | O$_2$ – 1500<br>N$_2$ – 290 | 500 | 272 | 81.2 | 84.7 | 94.2 | 96.5 | 91.3 | 87.2 |
| 5 | O$_2$ – 290<br>N$_2$ – 1500 | 550 | 122 | 83.0 | 79.2 | 84.2 | 81.5 | 84.4 | 82.7 |
| 6 | O$_2$ – 290<br>N$_2$ – 1500 | 575 | 250 | 80.0 | 77.6 | 92.0 | 88.0 | 80.0 | 81.2 |
| 7 | O$_2$ – 1500<br>N$_2$ – 290 | 550 | 163 | 88.2 | 91.2 | 82.5 | 85.0 | 92.3 | 98.8 |
| 8 | O$_2$ – 1500<br>N$_2$ – 290 | 500 | 236 | 91.2 | 89.8 | 83.0 | 85.0 | 93.0 | 98.7 |

EXAMPLE 4

The procedure of Example 3, Run 1, was followed except that the nitrogen stream bubbled through the antimony compound was first saturated with water.

Variations in conductivity and transmission due to variations in substrate temperature and reaction time are summarized in Table IV below:

Table IV

| Run | Substrate Temperature, °C. | Reaction Time, minutes | Sheet Resistivity, ohms/square | % Transmission Wavelength of Light, Angstroms | | | | | |
|---|---|---|---|---|---|---|---|---|---|
| | | | | 4000 | 4400 | 4800 | 5200 | 5600 | 6000 |
| 1 | 575 | 2.0 | 1630 | 83.5 | 80.9 | 80.6 | 80.0 | 80.5 | 81.3 |
| 2 | 575 | 2.5 | 1180 | 95.0 | 91.0 | 87.5 | 84.6 | 82.5 | 82.0 |
| 3 | 575 | 5.0 | 500 | 92.5 | 84.0 | 80.0 | 81.1 | 85.0 | 90.8 |
| 4 | 575 | 7.5 | 354 | 79.8 | 79.0 | 90.8 | 96.8 | 92.8 | 86.7 |
| 5 | 575 | 10.0 | 200 | 75.0 | 79.0 | 91.0 | 84.0 | 79.1 | 83.3 |
| 6 | 550 | 10.0 | 295 | 78.0 | 83.4 | 93.7 | 90.6 | 81.0 | 85.4 |

Table IV-continued

| Run | Substrate Temperature, °C. | Reaction Time, minutes | Sheet Resistivity, ohms/square | % Transmission Wavelength of Light, Angstroms | | | | | |
|---|---|---|---|---|---|---|---|---|---|
| | | | | 4000 | 4400 | 4800 | 5200 | 5600 | 6000 |
| 7 | 550 | 10.0 | 272 | | | | | | |

EXAMPLE 5

The procedure of Example 1 was followed except that different substrates were employed in place of the glass faceplates. Reaction was continued for about 10 minutes and the thickness of the layers was about 500 Angstroms. The substrates and conductivity data are summarized in Table V below.

Table V

| Substrate | Resistivity, ohms/square |
|---|---|
| spinel | 45,000 |
| sapphire | 28,000 |
| garnet | 18,000 |
| magnesium oxide | 50,000 |
| gallium arsenide | 3,800 |
| silicon | 15,000 |
| quartz | 9,500 |

EXAMPLE 6

The procedure of Example 1 was followed except substituting bis(tri-n-propyl)tin oxide as the organotin compound. Similar results are obtained.

EXAMPLE 7

The procedure of Example 1 was followed except substituting bis(tri-n-butyl)tin oxide as the organotin compound. Similar results are obtained.

We claim:

1. A process of depositing a coating of tin oxide on a substrate which comprises:
   a. heating the substrate from about 375° to about 500°C.,
   b. heating dibutyl tin diacetate in a stream of an inert carrier gas to a temperature from about 100° to about 200°C. to vaporize it, and
   c. contacting the carrier gas-dibutyl tin diacetate gas stream with the substrate in an oxidizing atmosphere until a coating of tin oxide has been deposited on the substrate.

2. A process according to claim 1 wherein the carrier gas-dibutyl tin diacetate gas stream temperature is maintained in the range between about 100° to about 150°C.

3. A process according to claim 2 wherein the substrate temperature is from about 425° to about 450°C.

4. A process according to claim 3 wherein the substrate is glass having a melting point above 450°C.

5. A process according to claim 1 wherein the oxidizing atmosphere contains water vapor.

6. An article prepared by the process of claim 1.

7. An article prepared by the process of claim 5.

8. A process of depositing an antimony-doped tin oxide coating on a substrate which comprises
   a. heating the substrate to about 500° to about 575°C.,
   b. heating a volatile organotin compound having a vaporization temperature below about 200°C. of the formula $(R\rightarrow_2Sn\leftarrow OOCR)_2$ or $(R_3Sn\rightarrow)_2O$ wherein R is a lower alkyl group in a stream of an inert carrier gas to at least its vaporization temperature,
   c. admixing the carrier gas-organotin vapor with a carrier gas stream containing vaporized antimony pentachloride, and
   d. contacting the organometallic vapors with the heated substrate in an oxidizing atmosphere until a coating of antimony-doped tin oxide has been deposited on the substrate.

9. A process according to claim 8 wherein the organotin compound is dibutyl tin diacetate.

10. A process according to claim 8 wherein the oxidizing atmosphere contains water vapor.

11. A process of depositing transparent, uniform, electrically conductive coatings of tin oxide on a vidicon faceplate which comprises:
    a. vaporizing dibutyl tin diacetate in a stream of an inert carrier gas at a temperature of from about 100° to about 200°C.,
    b. heating the faceplate to a temperature from about 375° to about 450°C., and
    c. contacting the heated faceplate with the dibutyl tin diacetate-carrier gas stream in the presence of oxygen for about 5 to about 15 minutes so as to form a coating of tin oxide on the faceplate.

12. A process according to claim 11 wherein the oxidizing atmosphere contains water vapor.

* * * * *